Sept. 16, 1969 J. L. McKINNEY 3,467,958

ANALOG TO DIGITAL CONVERTER USING A PLURALITY OF RADIX AMPLIFIERS

Filed Dec. 29, 1965 2 Sheets-Sheet 1

INVENTOR

JAMES L. McKINNEY

BY Sughrue, Rothwell, Mion, Zinn & Macpeak

ATTORNEYS

ANALOG TO DIGITAL CONVERTER USING A PLURALITY OF RADIX AMPLIFIERS

Filed Dec. 29, 1965 2 Sheets-Sheet 2

INVENTOR
JAMES L. McKINNEY

BY Hughes, Rothwell, Mion, Zinn & Macpeak
ATTORNEYS

United States Patent Office 3,467,958

Patented Sept. 16, 1969

3,467,958

ANALOG TO DIGITAL CONVERTER USING A PLURALITY OF RADIX AMPLIFIERS

James L. McKinney, Littleton, Colo., assignor to Martin-Marietta Corporation, New York, N.Y., a corporation of Maryland Filed Dec. 29, 1965, Ser. No. 517,278
Int. Cl. H03k *13/02*
U.S. Cl. 340—347 6 Claims

ABSTRACT OF THE DISCLOSURE

An analog-to-digital converter of the comparison type which uses a plurality of stages each made up of a threshold detector, a subtractor and a radix amplifier. The input analog signal is quantized by the first threshold detector; that quantized level is subtracted from the input and the remainder is amplified by the radix factor. The amplified remainder then goes to the next stage where the same operation is again performed. The output of the threshold detectors is the digital indication of the analog level.

The invention relates to a high speed analog to digital converter and, more particularly, to a high speed analog to digital converter which is capable of asynchronous operation.

Analog to digital converters and their uses are well known in the prior art. Also, it is well known that speed of conversion is a very important factor in such systems, especially those used in conjunction with "real-time" systems, such as missiles. The two major types of analog to digital converters used in the prior art are:

(1) A successive bit by bit comparison beginning with the most significant and ending with the least significant bit;

(2) A time measuring system wherein the clock pulses are counted between the time it takes a sawtooth to rise from a reference value to a value equal to the analog input signal.

In the prior art bit by bit comparison analog to digital converters, a bit comparison takes place in response to each clock pulse, beginning with the highest order bit and ending with the lowest order bit. The maximum speed capabilities of such a system is a conversion time which is equal to the interval between the clock pulses multiplied by the number of bits to be converted.

In the time maesuring conversion systems, the maximum speed capabilities depend upon the particular value of the analog signal. For example, if the analog signal being converted is large, the time interval is large and if the analog signal is small the time interval is also small. In this method of conversion, the reference can be generated by flip flops and ladder networks which give a staircase reference, or by a ramp generator which gates a counter and comparator.

Until recently, the time measurement conversion system was faster and just as accurate as the bit by bit method because system clock rates were in the 100 kc. range. This is no longer true as system clock rates are moving toward a megacycle in many cases and the time interval method can no longer compete with the bit by bit comparison method. To equal the bit by bit comparison in systems having a one megacycle clock rate, the time interval method would have to count at better than thirty megacycles. This would mean discrete components, larger size and greatly reduced reliability. However, both methods are reaching their extreme capabilities and new concepts are necessary for converters which will operate with speeds that are compatible with other high speed circuitry.

The present invention is a new and improved analog to digital converter which converts on a comparison basis similar to the bit by bit comparison systems but instead of having each stage compare a single bit, each stage compares a plurality of bits. Also, the present invention is capable of asynchronous operation and therefore its maximum speed capabilities are determined not by any clock rates but by the speed limitations of the amplifiers between the several stages. By utilizing the conversion system of the present invention in conjunction with known amplifier techniques, an eight bit conversion can be made in four microseconds. Furthermore, the present invention has flexibility for even higher speed requirements of the future because as amplifiers improve, the speed of conversion and accuracy of the system also will improve.

In a preferred embodiment of the present invention, the converter is made up of stages, each converting two bits of analog data and each stage including a threshold detection module, a subtractor module, and a logic module. The stages are coupled by a very broad band stable DC amplifier having a constant gain of four. All stages are identical except for the last stage which does not require a subtractor module. If the system requirements with which the present invention is being used does not require a binary output but will allow a different type of digital output, the logic module may be eliminated and a threshold module may directly control several stages of the output register.

Some of the advantages of the present invention are: conversion speed capabilities are far beyond anything presently in use, its modular construction permits efficient trouble shooting in the field, it lends itself to circuit miniaturization, it has maximum flexibility since its length can be changed by changing only the number of stages, its input may be tied directly to the analog signal thereby eliminating the need for sample and hold circuits, and it has excellent linearity.

It is therefore an object of the present invention to provide a new and useful high speed analog to digital converter.

A further object of the present invention is to provide a new and useful system for converting analog signals into a binary code.

Another object of the present invention is to provide a new and improved analog to digital converter which follows the ups and downs of the analog input signal.

The foregoing and other objects, features and advantages of the invention will be apparent from the following more particular description of a preferred embodiment of the invention, as illustrated in the accompanying drawings.

Throughout the following explanation the system will be explained in reference to a ten bit converter wherein the smallest analog voltage of interest is five millivolts. In other words, assuming a binary output, if the analog signal is below five millivolts the output is 0000000000, and if the analog input is greater than or equal to five millivolts and less than ten millivolts, the output is 0000000001. The five millivolt unit is selected because according to present amplifier capabilities it is the smallest unit permissible. Anything smaller would be masked by the amplifier drift. However, it should be noted that larger units of interest may be used and also the system will operate with smaller units of interest, such as one millivolt, when future amplifiers having improved operation are introduced.

Figures 1, 2:
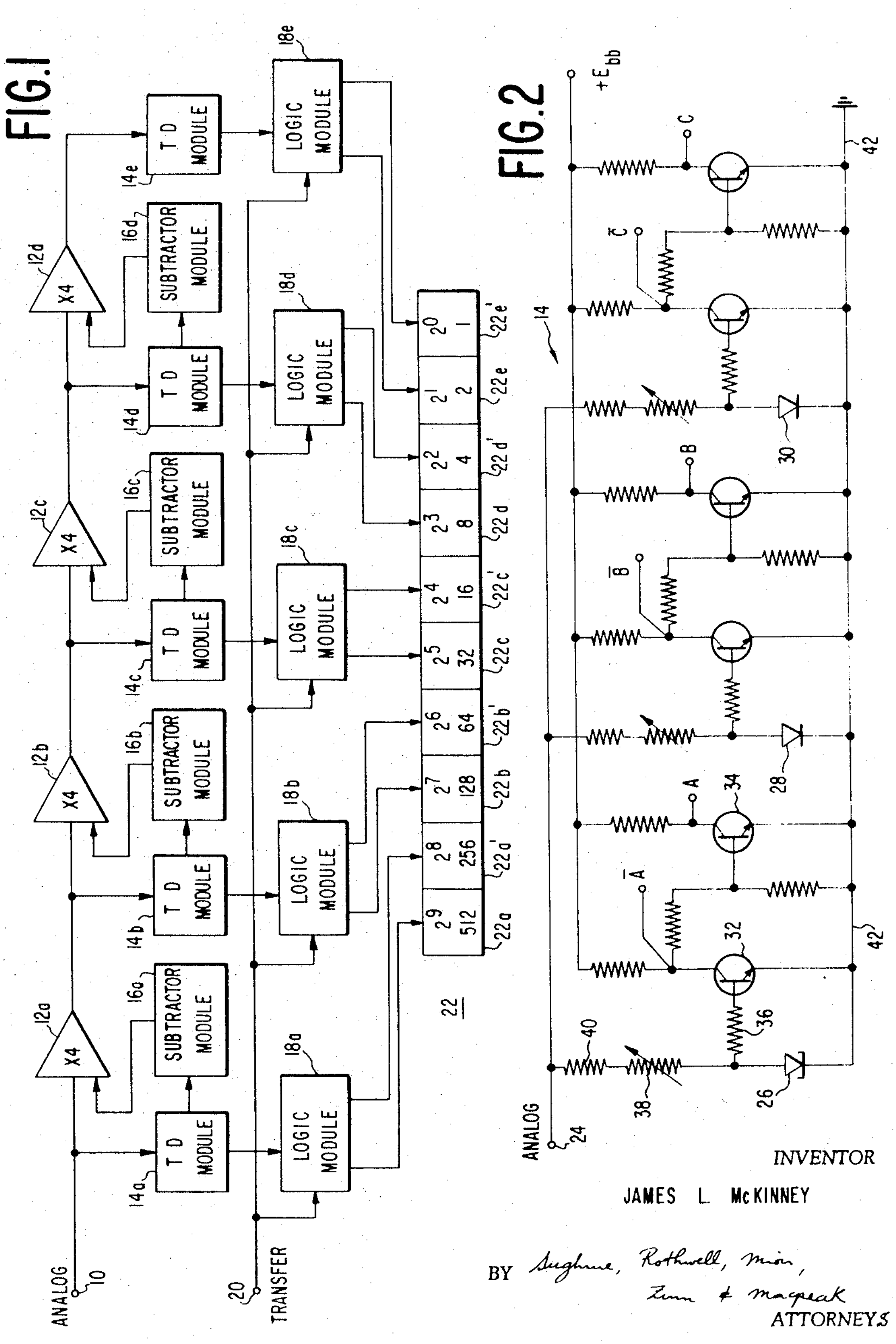
FIGURE 1 is a block diagram of a preferred embodiment of the present invention.
FIGURE 2 is a schematic diagram of a circuit which may serve as the threshold device module of FIGURE 1.

Referring now to FIGURE 1, the system shown receives an analog signal at the input terminal 10 and provides a binary output in register 22, wherein a single unit of the binary output is equal to five millivolts. Since each stage converts two bits of information, five stages are necessary for a ten bit binary converter. Each stage except the last stage comprises a threshold detector module 14, a subtract module 16, and a logic module 18. The last stage comprises only a threshold detector module 14 and a logic module 18. The stages are interconnected by amplifiers 12 which have an amplification factor of four. The output may appear in a register 22 which comprises a plurality of switches or bistable devices **22*a* through 22*e*′. The small letters in the drawing are used to indicate the different stages. The first stage controls flip flops 22*a* and 22*a*′; the second stage controls flip flops 22*b* and 22*b*′; the third stage controls flip flops 22*c* and 22*c*′, etc. The bistable devices will be referred to as being either ON (corresponding to a binary one) or OFF (corresponding to a binary zero). The numbers appearing in the blocks representing the bistable devices are the decimal equivalents of a binary one at the particular stage of the output register 22. For example, if bistable device 22*e*** is turned ON and all the rest are turned OFF, the binary output is 0000000001, indicating that the analog input is greater than or equal to five millivolts and less than ten millivolts. If the binary output is 1111101000, its decimal equivalent is 1000, and therefore the analog input is equal to five volts (1,000×5 millivolts=5,000 millivolts=5 volts).

Since each stage controls two binary bits, and further since two binary bits may have four unique values (00, 01, 10, 11), the threshold detector module must be operative to respond to four different levels of input voltage to provide four different outputs. Referring to the fifth stage of the converter, when the input to threshold detector module **14*e* is less than a first threshold level, the output of threshold detector module 14*e* must control logic module 18*e* so that neither 22*e* nor 22*e*′ are turned ON when a transfer pulse is applied at terminal 20. If the level of the input to module 14*e* is equal to or above the first threshold level but less than the second threshold level, the output therefrom must control logic 18*e* so that flip flop 22*e*′ is turned ON and flip flop 22*e* remains OFF when a transfer pulse is applied to terminal 20. When the input level is above the second threshold level but below the third threshold level, the output from 14*e* must control logic module 18*e* so that when a transfer pulse is applied to terminal 20, bistable 22*e* is turned ON and bistable 22*e*′ remains turned OFF. If the level of the input signal applied to threshold detector module 14*e* is equal to or greater than the third threshold level, the output of threshold detector module 14*e* must control the logic module 18*e* so that when a transfer pulse is applied to terminal 20, bistable devices 22*e* and 22*e*′** are turned ON.

Since the lowest analog signal of interest is five millivolts, the lowest threshold level of threshold detector module **14*e* must be set to respond to a five millivolt signal at terminal 10. Therefore, the lowest threshold level of threshold detector module 14*e*** is set at 1.28 volts and the present example (5 millivolts×4×4×4×4=1.28 volts). The second threshold level is 1.28 volts×2 or 2.560 volts, and the third threshold level is 1.28 volts×3 or 3.840 volts.

The subtractor modules 16 are arranged to provide a voltage output which will be subtracted from the analog input to an amplifier 12. The value of the voltage to be subtracted depends upon the output of the threshold detector module 14 which in turn depends upon the level of the voltage applied as an input to the threshold detector module 14. For example, if the input to threshold detector module **14*a* is 1.20 volts, a value below the lowest threshold level, the subtractor module will provide a zero volt output signal to be subtracted from the 1.20 volt signal applied as an input to amplifier 12*a*. If the input voltage applied to threshold detector module 14*a* is equal to 1.40 volts, the first threshold will be surpassed but the second and third thresholds will not be surpassed. Consequently, the subtractor module will operate to provide a 1.28 volt output which will be subtracted from the 1.40 volt analog input to amplifier 12*a***. The remaining two subtraction voltage outputs from the subtractor module are 2.560 volts and 3.840 volts. Stated in general terms, the subtractor module is operative to subtract a certain voltage from the analog input to the amplifier, wherein that certain voltage is equal in value to the highest threshold level equalled or surpassed in the threshold detector module of the same stage.

The operation of the converter of FIGURE 1 may be better understood by following the specific example wherein the analog input signal is 5 volts. In stage 1, the analog input signal to threshold detector module **14*a* is above the third threshold level (3.840 volts) so the stage is operative upon receipt of a transfer pulse from terminal 20 to turn on flip-flop 22*a* and 22*a*′. The subtractor module 16*a* provides an output which subtracts 3.840 volts from the 5 volt input. The difference in voltage, which is 1.160 volts, is multiplied by 4 in amplifier 12*a* and applied as the analog input signal to the second stage. Since 4.64 volts is above the third threshold level of threshold detector module 14*b*, that module in combination with the logic module 18*b* is operative upon receipt of a transfer pulse from terminal 20 to turn on flip flop 22*b* and 22*b*′. Subtractor module 16*b* then causes 3.84 volts to be subtracted from the 4.64 volt input signal resulting in a 0.800 volt signal which is multiplied by 4 in amplifier 12. The input to the third stage is 3.200 volts and exceeds the second threshold level of threshold detector module 14*c* but is below the third threshold level of threshold detector module 14*c*. Therefore, the latter module in combination with logic module 18*c* turns on flip flop 22*c* and allows flip flop 22*c*′ to remain in its OFF condition upon receipt of a transfer pulse. Since the second level only of the threshold has been exceeded, the subtractor module 16*c* is operative to subtract 2.560 volts from the 3.200 volt input signal leaving a remainder of 0.640 volt. The latter voltage is multiplied by 4 in amplifier 12*c* resulting in a 2.56 volt input to the fourth stage of the converter. Since 2.560 volts is equal to the second threshold level of threshold detector module 14*d*, the latter module in combination with logic module 18*d* turns on flip flop 22*d* and leaves flip flop 12*d*′ turned OFF when a transfer pulse is applied at terminal 20. The subtractor module 16*d* causes 2.560 volts to be subtracted from the 2.560 volt input resulting in a zero volt remainder. The latter remainder when multiplied by 4 in amplifier 12*d* remains at a zero volt level and therefore the input to the fifth stage does not exceed any threshold level. The final output in register 22** is 1111101000, the binary equivalent of 5 volts if the smallest unit is 5 millivolts.

Since the amplifier modules **12*a* through 12*d* are the slowest operating modules in the converter, the proper output signal appears at the output of the subtractor modules prior to amplification by the amplifiers. In other words, in reference to the example given above, the 3.840 volts appears at the output of subtractor module 16*a* prior to the time amplifier 12*a* amplifies the difference between the values appearing on the analog input lead and the subtractor input lead. Therefore, 1.160 volts, which is the difference between 5 volts and 3.840 volts, is amplified in amplifier 12*a*** rather than the 5 volts alone. However, it should be noted that asynchronous operation may be accomplished in the present device even if the amplifiers were capable of speeds equal to the speeds of the other modules. The reason for this result is that the threshold detector module is able to "follow" the input signal.

The threshold detector modules 14 may be said to "follow" the input signal by operating in the following manner. When the input signal is below a first threshold level the module 14 has a first combination of outputs. When the input level is equal to or greater than the first threshold level but less than the second threshold level it has a second combination of outputs. In most thresholding devices, the input signal would have to drop to a value significantly below the first threshold level before the output would revert to the aforesaid first combination of output signals. However, in the present threshold detector module, the output reverts to its first state when the input signal drops to a very slight level below the threshold level. Thus, even if very high speed amplifiers are developed and placed into the circuit, asynchronous operation may still be achieved. Because of the latter mentioned ability of the threshold detector module to follow the input signal, it is not necessary to sample the analog signal and hold it at the sampled value while conversion takes place. Instead, it is possible, with the present invention, to tie the input terminal 10 directly to the analog signal and allow the entire converter to follow the ups and downs of the analog voltage. Whenever it is desired to read out the digital equivalent of the analog voltage or transfer that digital information to some further circuitry, a transfer pulse is applied at terminal 20 and the logic outputs are gated ON.

The schematic of a threshold detector module 14 which may be used in the present invention is illustrated in FIGURE 2. As explained previously, since each stage converts two bits of binary data, three different threshold levels are necessary within the threshold detector module 14. Therefore, the circuit shown in FIGURE 2 is the parallel combination of three individual threshold circuits. Each circuit contains a tunnel diode which is biased to have a desired threshold level. When the threshold level is reached, the tunnel diode switches from its low voltage to a high voltage state. The three threshold circuits include tunnel diodes 26, 28, and 30, respectively. Since all three circuits are identical except for the resistance values, only the far left hand circuit will be explained in detail. It should be noted at the outset, that with reference to the example given above, tunnel diode 26 switches from its low voltage to its high voltage state when the input voltage at terminal 24 is equal to or greater than 1.280 volts; tunnel diode 28 switches from its low voltage to its high voltage state when the voltage at terminal 24 is equal to or greater than 2.560 volts; tunnel diode 30 switches from its low voltage to its high voltage state when the voltage at terminal 24 is equal or greater than 3.840 volts.

The individual thresholding circuits includes a resistance 40, a sensitor 38, and a tunnel diode 26 connected in series between the input terminal 24 and a reference terminal 42. The anode of tunnel diode 26 is also connected to the base of a transistor 32 via a resistance 36. The emitter of transistor 32 is connected to ground and its collector is connected to the positive power supply $E_{bb}$ through a biasing resistor. The collector terminal of transistor 32 is also resistively coupled to the base terminal of a second transistor 34 whose emitter is connected to the common terminal and whose collector is connected to the positive power supply $E_{bb}$ through a biasing resistor. The collectors of transistors 32 and 34 serve as output terminals, indicated as A and $\overline{A}$. The sensistor 38, which is in series with tunnel diode 26, temperature stabilizes the circuit as is well known in the art.

The operation of the circuit will be explained with reference to FIGURE 3 wherein curve 50 represents the voltage versus current characteristtics of tunnel diode 26 and T on the voltage axis represents the desired threshold of the first circuit. When the voltage at terminal 24 is below the threshold voltage, tunnel diode 26 is in its low voltage state, transistor 32 is cut OFF and transistor 34 is conducting. The output terminal $\overline{A}$ is high and the output terminal A is low indicating that the input voltage is below the first threshold level. Assuming that the input voltage is at a level C below the threshold level T, the load line is indicated by line 54 in FIGURE 3. Line 54 intersects curve 50 at point 62, and therefore the voltage at the anode of tunnel diode 26 is given by the value $V_1$. In order for the tunnel diode to switch to a high voltage state, its current must be increased from $I_c$ to $I_p$. Then the threshold voltage is reached at terminal 24, the current through tunnel diode 26 rises above the peak current causing the tunnel diode to switch to a high voltage state indicated at point 60 in the graph. The new load line is indicated by line 52, which illustrates how the increase in voltage from C to T causes the tunnel diode to switch to a high voltage state. Transistor 32 turns on and transistor 34 turns off causing $\overline{A}$ to be low and A to be high, indicating that the first threshold level has been reached. Resistance 36 is selected so that when transistor 32 is conducting, just enough base current is drawn away from the tunnel diode to bring the operating point near the valley of the tunnel diode curve as indicated at point 56 on the graph. Thus, if the input voltage drops only a slight amount below the threshold value, the current through tunnel diode 26 drops below the valley current $I_v$ causing the diode to switch to its low voltage state thereby turning off the transistor 32 and turning on transistor 34. It is this latter feature which allows the threshold detector module and the entire converter to follow the ups and downs of the analog input voltage.

The threshold voltage T of a particular tunnel diode is determined by the resistance values in the tunnel diode circuit. It is well known in the art that the threshold level can be made any desired value over a fairly wide range. Consequently, it is a mere matter of selecting the proper resistances to cause tunnel diodes 26, 28, and 30 to respond to threshold voltages of 1.280 volts, 2.560 volts, and 3.840 volts, respectively.

It should be noted that the individual threshold circuits need not include a second transistor, such as transistor 34, and a second output, but may have only a single output taken from a collector of the first transistor. Whether two outputs or only a single output is used depends upon the input requirements of the particular logic circuitry which is controlled by the threshold detector module outputs. In terms of positive logic, the output is $\overline{A}\overline{B}\overline{C}$ when the voltage level at the input terminal is below the first threshold level; the output is $A\overline{B}\overline{C}$ when the voltage at the input terminal is equal to or greater than the first threshold level but less than the second threshold level; the output is $AB\overline{C}$ when the input voltage is equal to or greater than the second threshhold level but less than the third threshold level; the output is ABC when the input voltage is greater than or equal to the third threshold level. If the digital output is to be in binary code, the threshold detector module outputs control two flip flop stages or switches of the output register in accordance with the following table:

| Number of threshold levels equalled or surpassed | Threshold detector module output | Binary code state of flip flops | Other code state of flip flops |
|---|---|---|---|
| 0 | $\overline{A}\overline{B}\overline{C}$ | 00 | 000 |
| 1 | $A\overline{B}\overline{C}$ | 01 | 001 |
| 2 | $AB\overline{C}$ | 10 | 011 |
| 3 | ABC | 11 | 111 |

Figures 3, 4, 5:
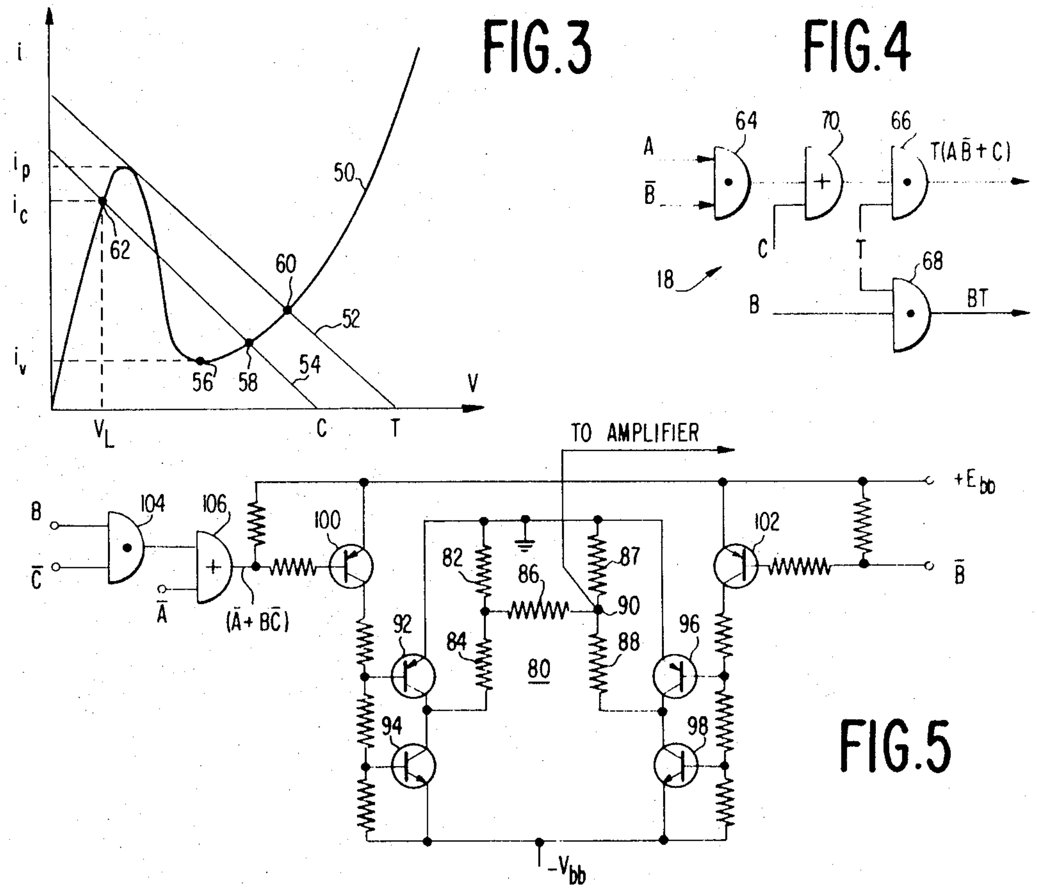
FIGURE 3 is a graph helpful in explaining the operation of FIGURE 2.
FIGURE 4 is a simple logic block diagram which may serve as the logic module of FIGURE 1.
FIGURE 5 is a schematic diagram of a circuit which may be used as the subtractor module of FIGURE 1.

A simple logic circuit which may be used as logic module 18 in the circuit of FIGURE 1 for converting the threshold detector module output logic into binary logic is indicated in FIGURE 4. The logic module comprises AND gates 64, 66, and 68 and OR gate 70. The output $T(A\overline{B}+C)$ is applied to the low order flip flop or switch of the binary output register, and the output BT is applied to the high order flip flop or switch of the binary register. For the purpose of understanding the logic module it is assumed that the output flip flops or switches respond to a high level voltage by turning on, or storing a binary 1 therein. The logic module operates as follows. When the threshold detector module output is $\overline{ABC}$, the inputs to AND gates 66 and 68 are low. Therefore, when the transfer pulse T arrives, neither flip flop will be turned on. When the threshold detector module output is $A\overline{BC}$, the arrival of a transfer pulse will raise the output of AND gate 66 which in turn switches on the low order flip flop. When the threshold detector module output is $AB\overline{C}$, the arrival of the transfer pulse causes the operative AND gate 68 only to go high thereby turning on only the higher order flip flops. When the threshold detector module output is ABC, the arrival of a transfer pulse causes both flip flops to be turned on.

It should be noted that although the binary code is the most common form of digital code used in computer circuitry, other codes may be used and the present invention is compatible with such other codes. The simplest code of all for the 3-threshold-level threshold detector module is indicated by the fourth column in the above table. That is the simplest code only in the sense that no logic module is necessary between the threshold detector module output and the stages of the output register. Instead, three output flip flops or switches are turned on directly by the A, B, and C outputs from the threshold detector module of each stage. The three flip flops or output switches would turn on in response to the A, B, and C outputs, respectively.

Figure 6:
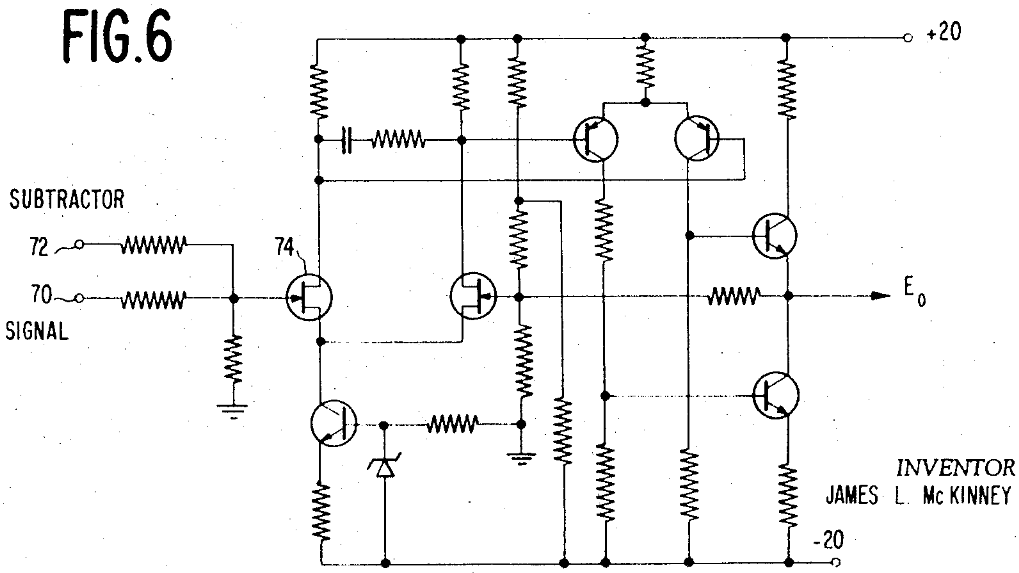
FIGURE 6 is a schematic diagram of a circuit which may be used as the amplifier of FIGURE 1.

The amplifiers used with the present invention must include subtraction networks in their input stages and must also be capable of amplifying the input voltages by a factor of 4. Various different amplifier designs known in the prior art are capable of meeting these requirements. The particular amplifier used forms no part of the present invention, but it should be understood that the better the amplifier, the better the operation of the overall device. One particular type of amplifier which may be used in the present invention is illustrated schematically in FIGURE 6. The input signal is applied to terminal 70 and the voltage from the subtractor module 16 is applied to terminal 72. The subtraction circuit is a resistive network of the type well known in the prior art. The voltage appearing at the gate of input FET74 is the difference between the signal and the subtractor module output.

As stated previously, the subtractor module 16 of FIGURE 1 must cause a number of different voltage values to be subtracted from the signal inputs to the amplifiers 12. For the particular example described above, the four different voltage levels to be subtracted are zero volts, 1.280 volts, 2.560 volts, and 3.840 volts. Although any circuit capable of performing the desired logic function of the subtractor module may be used in the present invention, one preferred circuit is shown by the schematic diagram of FIGURE 5. The subtractor module includes a resistive H-network 80 comprising resistors 82, 84, 86, 87, and 88. The output of the subtractor module which is applied to the subtractor input of the amplifier is taken from terminal 90 in the resistive network. Generally, the circuit operates by responding to the four different outputs from the threshold detector module to selectively short out the left hand and right hand legs of the resistive H-network. Specifically, the subtractor module of FIGURE 5 operates in response to the different outputs of the threshold detector module as follows. When the threshold detector module output is $\overline{ABC}$, the input to the base of transistor 100 is high and the input to the base of transistor 102 is also high. Consequently, transistors 100 and 102 are turned off causing transistors 92 and 96 to be turned on and transistors 94 and 98 to be turned off. When transistors 94 and 98 are turned off, they present a high impedance to the H-network. Both sides of the H-network are short-circuited allowing no current to flow therethrough, and thus the voltage at terminal 90 is 0.

When the threshold detector output is $A\overline{BC}$ the input to transistor 100 is low and the input to transistor 102 is high. The latter condition results in transistor 96 being turned on, thereby shorting the right hand leg of the resistive network, and transistor 92 being turned off thereby allowing current to flow through the left hand leg of the network. When the threshold detector module output is $AB\overline{C}$, the input to the base of transistor 100 is high and the input to the base of transistor 102 is low. This condition causes transistor 92 to be conducting, thereby shorting out the left hand leg of the resistive network, and transistor 96 to be cut off, allowing current to flow from the ground terminal through resistors 87 and 88 and through transistor 98 to the negative power supply $-V_{bb}$. When the output of the threshold detector module is ABC, the inputs to the base terminals of transistors 100 and 102 are low, causing transistors 92 and 96 to be cut off. This condition results in current flowing through both legs of the resistive network. The above-described four different states of the subtractor module cause four different voltage levels to appear at terminal 90. Those voltage levels, other than the zero volt level when both sides of the resistive network 80 are short-circuited, depend upon the value of the resistors 82, 84, 86, 87, and 88, and the value of the power supply $-V_{bb}$. The choice of the resistance values to achieve any desired levels of voltage outputs will be obvious to any one having ordinary skill in the art.

As indicated in the drawing, the base of transistor 102 may be tied directly to the $\overline{B}$ output of the threshold detector module, but the base of transistor 100 is connected to the output of a separate logic circuit comprising AND gate 104 and OR gate 106. The latter logic circuit is connected to threshold detector module output terminals $B\overline{C}$ and $\overline{A}$ as shown. The output of OR gate 106 may be described by the logic equation $\overline{A}+B\overline{C}$. The latter logic equation is the inverse of $A\overline{B}+C$, and therefore if the logic module 18 shown in FIGURE 4 is used, the output from OR gate 70, which is equal to $A\overline{B}+C$, may be applied through an invert gate to the base of transistor 100. This would eliminate the need for AND gate 104 and OR gate 106. Furthermore, since transistor 100 acts only as an inverter, the output from OR gate 70 of FIGURE 4 may be applied directly to the base terminals of transistors 92 and 94, thereby eliminating transistor 100.

Although the invention has been described in terms of an analog to digital converter wherein each stage comprises a threshold detector module having three threshold levels and four different output combinations, the invention applies equally as well to converters wherein the threshold detection modules are responsive to $n-1$ threshold levels and have $n$ different output combinations, where $n$ is an even multiple of 4. For example, by using seven individual threshold circuits within each threshold detector module instead of the three separate circuits indicated in the module of FIGURE 2, eight different combinations of output would be available. With eight different output combinations, three different flip flops of a binary output register could be controlled by a single stage of the analog digital converter. Changes would have to be made in the logic module and in the subtractor module. Also, since each stage controls three flip flops rather than two, the amplifiers would have to have an amplification factor of eight rather than four.

Furthermore, even though greatest conversion speed is achieved with asychronous operation, the invention may be used as a synchronously operated converter. Even if such operation were used, the invention would be faster than the prior art converters of the bit-by-bit comparison technique because each stage controls more than a single binary bit within a single clock time. This operation could be carried out by simply connecting clock pulses to turn on the several stages in succession following a sampling of the analog input.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An analog to digital converter for converting an analog voltage into a digital code comprising:

(a) a plurality of converter stages, each stage except a last stage comprising (i) an input terminal, (ii) threshold detector module means comprised of $n-1$ individual threshold circuits each including (aa) a tunnel diode connected in series with a load resistance between said input terminal and a threshold terminal at the threshold voltage associated with said threshold circuit, (bb) means responsive to the state of said tunnel diode for providing a first level of voltage output when said tunnel diode is in its low voltage state and a second level of voltage output when said tunnel diode is its in high voltage state, and (cc) means connected to said tunnel diode for diverting current from said tunnel diode to cause the operating point of said tunnel diode to be substantially at the valley point on its I–V curve when said tunnel diode is in its high voltage state, (dd) said threshold detector module means being thereby responsive to the amplitude of the voltage at said input terminal for providing one out of a possible $n$ combinations of logic outputs, the particular one output logic combination being dependent upon the number of threshold levels equaled or surpassed by the input voltage, where $n$ is an integral multiple of 4;

(ii) subtractor module means, responsive to the $n$ output logic combinations of said threshold means, for providing an output voltage equal in value to the highest threshold level of said threshold means that is equaled or surpassed by the voltage at said input terminal and for providing a zero volt output when the input voltage is below the lowest threshold level; and (iv) means for subtracting the output of said subtractor module means from the voltage at said input terminal and for amplifying the resulting difference voltage by a factor of $n$ and for providing an output of the amplifier voltage;

(b) means for connecting the amplifier output from each stage to the input terminal of the succeeding stage;

(c) means for connecting the analog voltage to be converted to the input terminal of the first stage; and (d) said last stage comprising an input terminal and a threshold detector module means described in (a)(ii) above.

2. An analog to digital converter as claimed in claim 1 wherein $n=4$.

3. An analog to digital converter as claimed in claim 2 wherein said subtractor module means comprises (a) a resistive H-network, a terminal in one leg of said H-network serving as the subtractor module means output, (b) means responsive to the first and second logic combination outputs from said threshold detector module means for short-circuiting said one leg of said resistive H-network and responsive to the third and fourth logic combination outputs from said threshold detector module means for connecting said one leg between a power supply terminal and ground, and (c) means responsive to the first and third logic combination outputs from said threshold detector module means for short-circuiting the other leg of said resistive H-network and responsive to the second and fourth logic combinations outputs from said threshold detector module means for connecting said other leg between said power supply terminal and ground.

4. An analog to digital converter as claimed in claim 2 further comprising a binary output register having two stages per converter stage, and logic means associated with each converter stage and responsive to the four logic combination outputs from said threshold detector module means for inserting the binary values 00, 01, 10, 11, respectively, into the two register stages associated with the converter stage.

5. An analog to digital converter as claimed in claim 3 further comprising a binary output register having two stages per converter stage, and logic means associated with each converter stage and responsive to the four logic combination outputs from said threshold detector module means for inserting the binary values 00, 01, 10, 11, respectively, itno the two register stages associated with the converter stage.

6. An analog to digital converter as claimed in claim 1 further comprising a binary output register having a number of stages equal to $ky$, where $k$ is the number of converter stages and $2^y=n$, each of said converter stages further comprising logic means responsive to the logic combination outputs from said threshold detector module means for providing outputs representing the binary code to $y$ stages of said binary output register.

References Cited

UNITED STATES PATENTS 3,072,322 1/1963 Margopoulos ---- 340—347 X

OTHER REFERENCES

R. K. Richards: "Digital Computer Components and Circuits," November 1957, pages 492–493.

MAYNARD R. WILBUR, Primary Examiner

C. D. MILLER, Assistant Examiner